United States Patent
Kitamura et al.

(10) Patent No.: US 6,628,687 B2
(45) Date of Patent: Sep. 30, 2003

(54) SEMICONDUCTOR LASER EMITTING APPARATUS

(75) Inventors: Tomoyuki Kitamura, Kanagawa (JP); Yuichi Hamaguchi, Tokyo (JP)

(73) Assignee: Sony Corporation, Tokyo (JP)

( * ) Notice: Subject to any disclaimer, the term of this patent is extended or adjusted under 35 U.S.C. 154(b) by 59 days.

(21) Appl. No.: 09/790,018

(22) Filed: Feb. 21, 2001

(65) Prior Publication Data

US 2001/0043631 A1 Nov. 22, 2001

(30) Foreign Application Priority Data

Feb. 21, 2000 (JP) .................... P2000-042338

(51) Int. Cl.[7] .............................. H01S 3/14
(52) U.S. Cl. ........................... 372/46; 372/45
(58) Field of Search ..................... 372/45, 43, 44, 372/46

(56) References Cited

U.S. PATENT DOCUMENTS

| | | | | |
|---|---|---|---|---|
| 4,309,668 A | * | 1/1982 | Ueno et al. ............... | 372/46 |
| 4,890,293 A | * | 12/1989 | Taneya et al. ............. | 372/45 |
| 4,961,197 A | * | 10/1990 | Tanaka et al. ............. | 372/45 |
| 4,965,806 A | * | 10/1990 | Ashby et al. .............. | 372/45 |
| 5,003,549 A | | 3/1991 | Mitsui et al. ............. | 372/46 |
| 5,388,116 A | * | 2/1995 | Ohkubo et al. ............. | 372/45 |
| 5,557,627 A | * | 9/1996 | Schneider et al. .......... | 372/46 |
| 6,023,483 A | * | 2/2000 | Shimoyama et al. ......... | 372/45 |

FOREIGN PATENT DOCUMENTS

| | | |
|---|---|---|
| JP | 6024084 | 2/1985 |
| JP | 63288086 | 11/1988 |
| JP | 2031487 | 2/1990 |
| JP | 3076287 | 4/1991 |
| JP | 6216461 | 8/1994 |
| JP | 252585 | 9/2000 |

* cited by examiner

*Primary Examiner*—Paul Ip
*Assistant Examiner*—Dung T Nguyen
(74) *Attorney, Agent, or Firm*—Sonnenschein, Nath & Rosenthal LLP (57) ABSTRACT

To stabilize the near field pattern (NFP) in a semiconductor laser emitting apparatus which emits a laser beam in a multi-lateral mode and extend the application fields of the apparatus. A semiconductor laser emitting apparatus, which emits a laser beam in a multi-lateral mode, and comprises a cladding layer in a stripe form formed on an active layer, wherein a current injection region of the semiconductor laser emitting apparatus has a difference in optical absorption loss between the inside and the outside of the current injection region, wherein the cladding layer disposed on the outside of the current injection region is formed so as to have a thickness of 0.7 μm or less.

16 Claims, 9 Drawing Sheets

SEMICONDUCTOR LASER EMITTING APPARATUS

RELATED APPLICATION DATA

The present application claims priority to Japanese Application No. P2000-042338 filed Feb. 21, 2000, which application is incorporated herein by reference to the extent permitted by law.

BACKGROUND OF THE INVENTION

1. Field of the Invention

The present invention relates to a semiconductor laser emitting apparatus. More particularly, the present invention is concerned with a semiconductor laser emitting apparatus which emits a laser beam in a multi-lateral mode, in which the near field pattern (hereinafter, frequently referred to simply as "NFP") is stabilized.

2. Description of the Related Art

Figure 8:
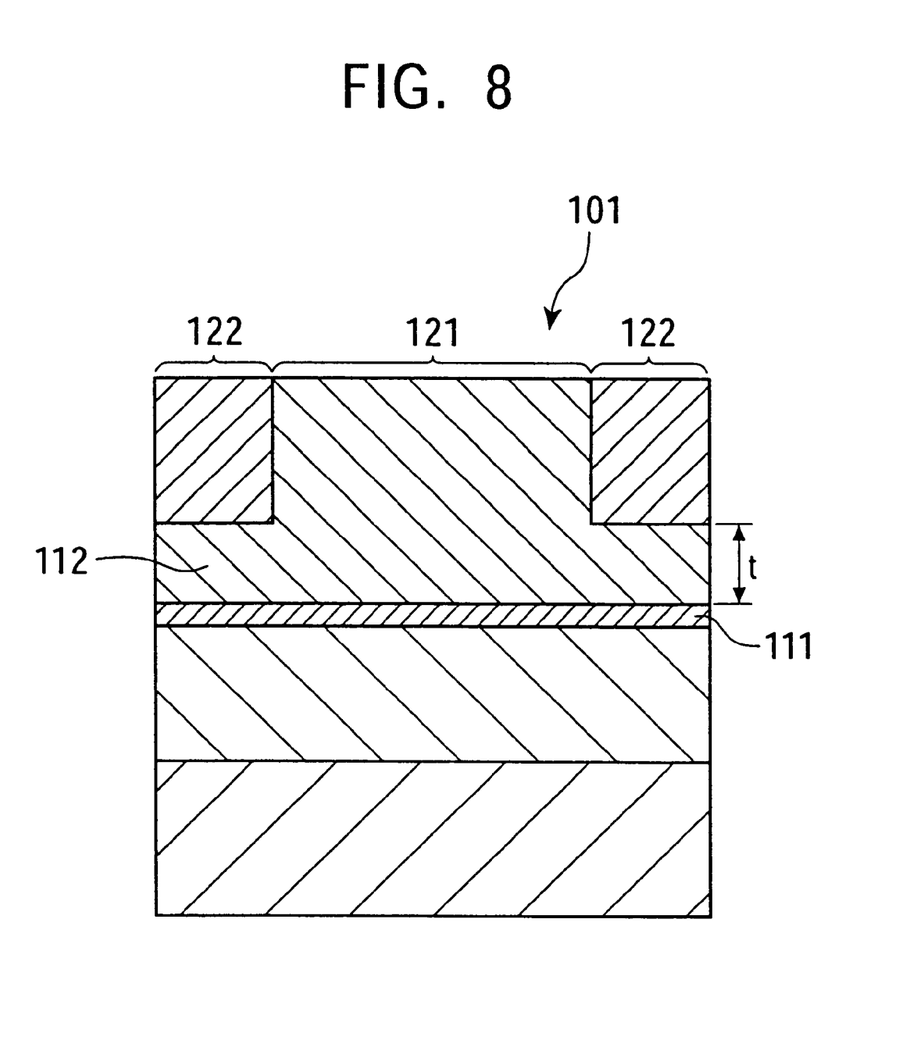
FIG. 8 is a diagrammatic cross-sectional view showing a conventional semiconductor laser emitting apparatus.

A conventional semiconductor laser emitting apparatus which emits a laser beam in a multi-lateral mode has, on an active layer, a cladding layer having a stripe structure such that the width is as large as 10 μm or more (i.e., wide-stripe structure), and has a structure shown in FIG. 8.

As shown in FIG. 8, in a conventional semiconductor laser emitting apparatus 101 which emits a laser beam in a multi-lateral mode, a part of a cladding layer 112 formed on an active layer 111 is in a stripe form, and this stripe-form portion constitutes a current injection region 121. On both sides of the current injection region 121, current non-injection regions 122 having implanted thereinto, for example, boron ions ($B^+$) are formed. The cladding layer 112 is formed so that the thickness t of the portions of the cladding layer 112 under the current non-injection regions 122 becomes 1 μm or more, for example, about 1.3 μm.

However, in the conventional semiconductor laser emitting apparatus which emits a laser beam in a multi-lateral mode, the NFP is unstable at a certain injection current value (output). This phenomenon is described below with reference to FIGS. 9A and 9B.

Figure 9A:
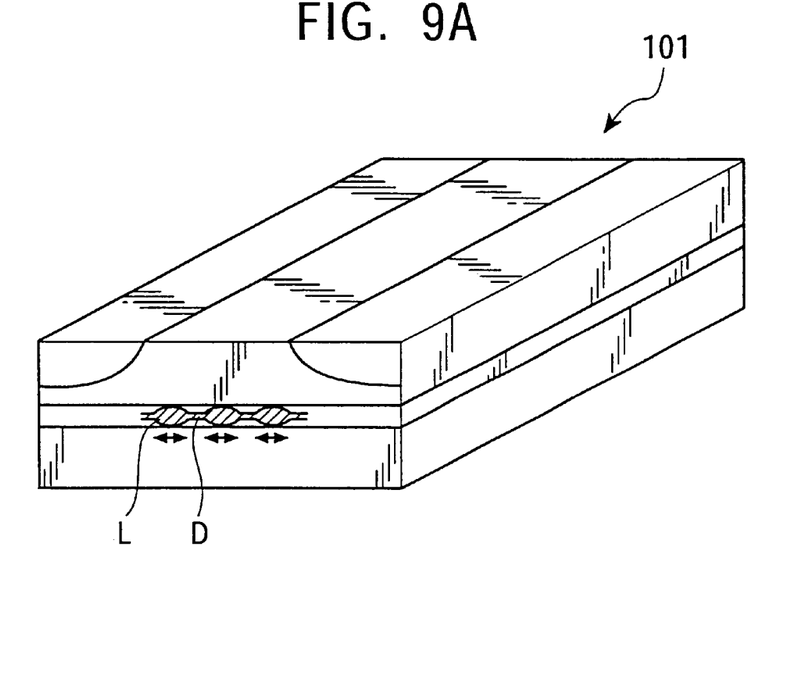
FIGS. 9A and 9B are diagrammatic explanatory views illustrating a problem of a conventional semiconductor laser emitting apparatus.
Figure 9B:
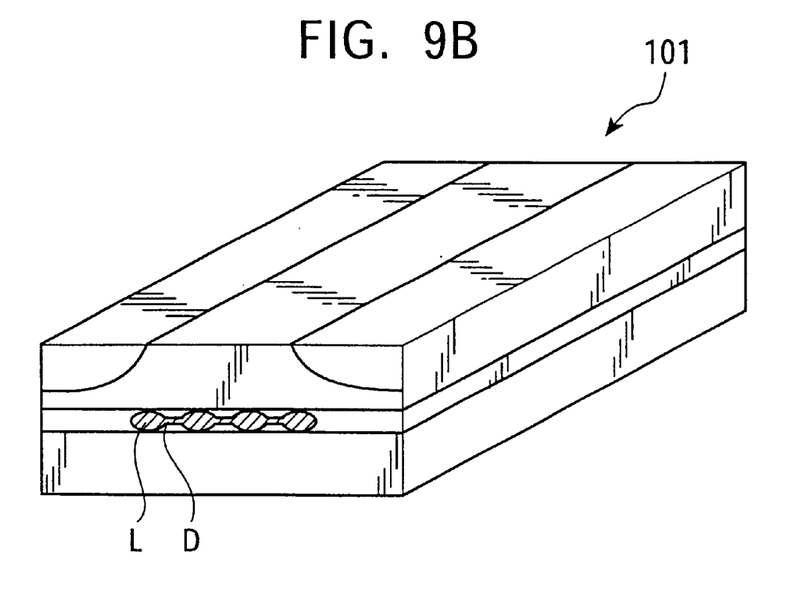

In a semiconductor laser emitting apparatus 101 shown in FIG. 9A, light portions L and dark portions D are formed in the NFP. As the injection current value (or an optical output) is changed, the light portions L are seen so that they fluctuate in the right and left directions (as indicated by arrows). Alternatively, a part of or a whole of the light portions and dark portions in the NFP is changed, so that, as shown in FIG. 9B, the semiconductor laser emitting apparatus 101 is in a state such that the light portions L and the dark portions D in the NFP are reversed. That is, the light portions L and the dark portions D irregularly change places with one another with a lapse of time. In addition, a change in the light emission strength is observed at the edge of the NFP. Thus, the NFP becomes unstable with time.

The above phenomenon in which the light and dark portions in the NFP fluctuate is a problem inherent in the multi-lateral-mode semiconductor laser emitting apparatus, and does not arise in the semiconductor laser emitting apparatus having a narrower stripe width (for example, about 3 μm or less), i.e., the so-called single mode oscillation semiconductor laser emitting apparatus.

In addition, in a conventional semiconductor laser emitting apparatus having a gain waveguide structure, a difference in refractive index is not made between the portion directly under the portion in a stripe form and the outside thereof. Therefore, the NFP broadens also in the direction of the outside of the portion directly under the portion in a stripe form, so that there occurs the above phenomenon in which the NFP becomes unstable.

When the above semiconductor laser emitting apparatus is used in a machine required to achieve a uniformity of light emission, such as a printer, the phenomenon in which the NFP becomes unstable causes unevenness (for example, printing unevenness in a case of a printer). For obtaining the uniformity of light emission, there is a method in which an oscillated laser beam is once passed through an optical fiber so that it becomes uniform, and the resultant uniform laser beam is used. However, the use of this method disadvantageously causes an increase in cost.

Further, the current value at which the NFP becomes unstable varies depending on operation conditions, such as a temperature of the environment for operation, and, the semiconductor laser emitting apparatuses produced from the same materials under the same conditions respectively have different current values at which the phenomenon in which the NFP becomes unstable occurs. Therefore, it has been difficult to operate the semiconductor laser emitting apparatus while avoiding the operating point at which the NFP becomes unstable.

SUMMARY OF THE INVENTION

The present invention is a semiconductor laser emitting apparatus which has been made for solving the above-mentioned problems accompanying the conventional art.

The semiconductor laser emitting apparatus of the present invention emits a laser beam in a multi-lateral mode and comprises a cladding layer in a stripe form formed on an active layer, wherein a current injection region of the semiconductor laser emitting apparatus has a difference in optical absorption loss between the inside and the outside of the current injection region, wherein the cladding layer disposed on the outside of the current injection region is formed so as to have a thickness of 0.7 μm or less. Alternatively, in the semiconductor laser emitting apparatus of the present invention, a current injection region has a difference in optical absorption loss between the inside and the outside of the current injection region, and the cladding layer is formed only in the current injection region.

In the semiconductor laser emitting apparatus of the present invention, the cladding layer disposed on the outside of the current injection region is formed so as to have a thickness of 0.7 μm or less. Therefore, a current is efficiently injected into the current injection region, so that the current leakage amount is suppressed. Further, the current injection region of the semiconductor laser emitting apparatus has a difference in optical absorption loss between the inside and the outside of the current injection region. Therefore, the waveguide of a laser can be changed between the inside and the outside of the current injection region in a stripe form, so that the laser is efficiently kept directly under the portion in a stripe form, thus making it possible to obtain a stable NFP free of fluctuation in the light portions and the dark portions therein.

As mentioned above, in the semiconductor laser emitting apparatus of the present invention, the cladding layer disposed on the outside of the current injection region is formed so as to have a thickness of 0.7 μm or less, or the cladding layer is formed only in the current injection region. Therefore, the current leakage amount can be suppressed, making it possible to efficiently inject a current into the current injection region. In addition, the current injection region of the semiconductor laser emitting apparatus has a difference in optical absorption loss between the inside and the outside of the current injection region. Therefore, the waveguide of a laser can be changed between the inside and the outside of the current injection region in a stripe form, so that the laser is efficiently kept directly under the portion in a stripe form, rendering it possible to obtain a stable NFP without problems of a change with time in the light emission pattern, a change in the strength at an edge of the NFP, and the like caused by the changing of the optical output or current injection amount, which problems have been inevitably encountered in the conventional semiconductor laser emitting apparatus which emits a laser beam in a multi-lateral mode.

Thus, the semiconductor laser emitting apparatus which emits a laser beam in a multi-lateral mode can be applied to the fields which are required to achieve a uniformity of light emission. Further, the uniformity of light emission can be achieved without using an optical fiber, and hence, an increase in cost can be prevented.

BRIEF DESCRIPTION OF THE DRAWINGS

The foregoing and other objects, features and advantages of the present invention will be apparent to those skilled in the art from the following description of the presently preferred exemplary embodiments of the invention taken in connection with the accompanying drawings, in which.

DETAILED DESCRIPTION OF THE PREFERRED EMBODIMENT

The semiconductor laser emitting apparatus according to the first embodiment of the present invention is described below with reference to the diagrammatic cross-sectional view of FIG. 1.

Figure 1:
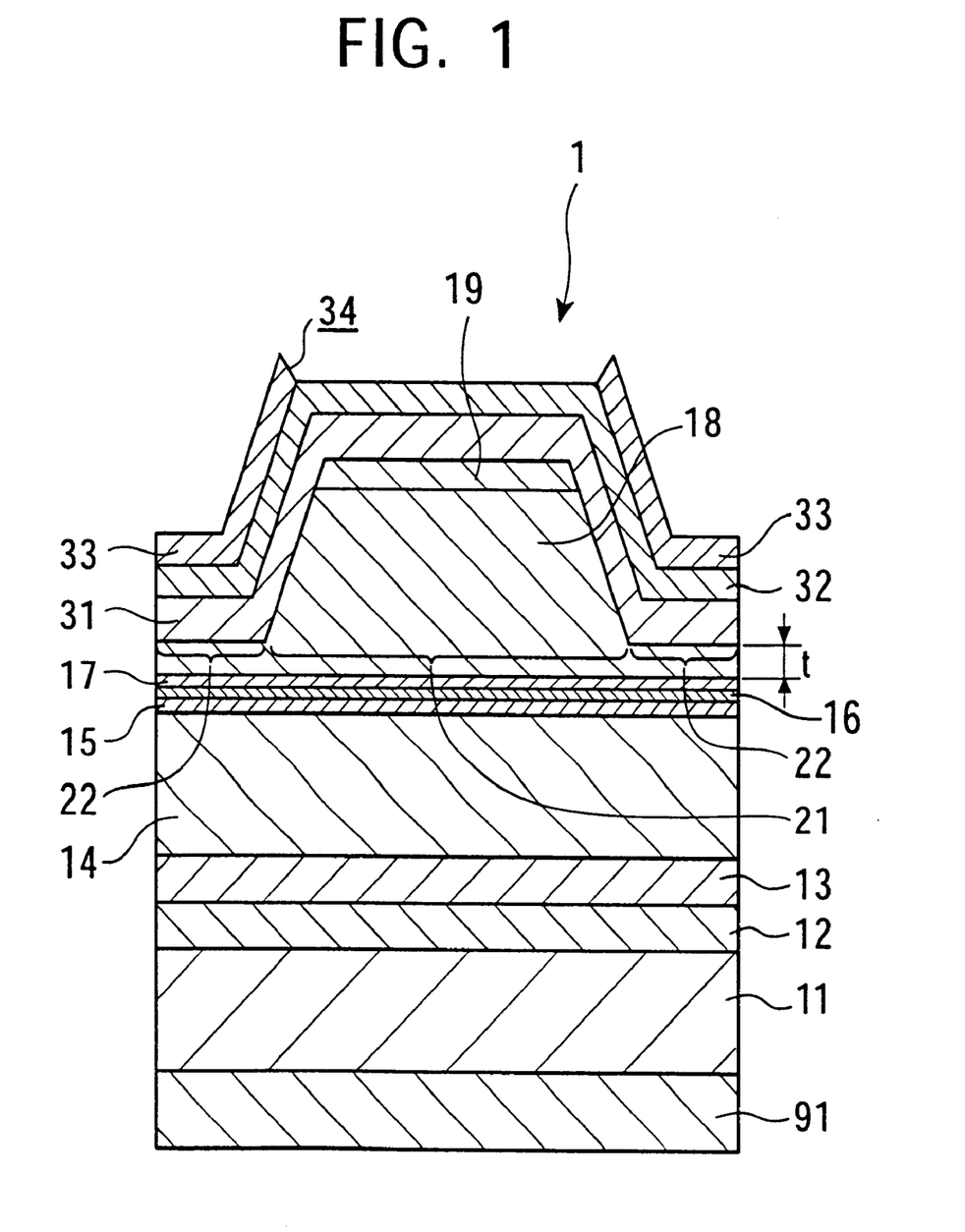
FIG. 1 is a diagrammatic cross-sectional view showing a semiconductor laser emitting apparatus according to the first embodiment of the present invention.

As shown in FIG. 1, in a first semiconductor laser emitting apparatus 1, on a surface side of a substrate 11 comprised of a GaAs substrate, a first n-type buffer layer 12, a second n-type buffer layer 13, an n-type cladding layer 14, a guide layer 15, an active layer 16, a guide layer 17, a p-type cladding layer 18, and a p-type cap layer 19 comprised of p-type GaAs are formed in this order from bottom. On the other hand, on a back side of the substrate 11, an n-type electrode layer 91 is formed.

As examples of the above layers, the following can be mentioned. The first n-type buffer layer 12 is formed by depositing n-type GaAs so as to have a thickness of, for example, 0.5 $\mu$m, and the second n-type buffer layer 13 is formed by depositing n-type $Al_{0.3}Ga_{0.7}As$ so as to have a thickness of, for example, 0.5 $\mu$m. In addition, the n-type cladding layer 14 is formed by depositing n-type $Al_xGa_{1-x}As$ so as to have a thickness of, for example, 1.8 $\mu$m. Further, the guide layer 15 is formed by depositing $Al_{0.3}Ga_{0.7}As$ so as to have a thickness of, for example, 60 to 65 nm, and the active layer 16 is formed by depositing $Al_{0.1}Ga_{0.9}As$ so as to have a thickness of, for example, 10 nm, and the guide layer 17 is formed by depositing $Al_{0.3}Ga_{0.7}As$ so as to have a thickness of, for example, 60 to 65 nm. Furthermore, the p-type cladding layer 18 is formed by depositing p-type $Al_xGa_{1-x}As$ so as to have a thickness of, for example, 1.8 $\mu$m. In the above chemical formulae for the layer materials, the atomic ratio x of aluminum (Al) is, for example, 0.5 (x=0.5).

The p-type cap layer 19 and the p-type cladding layer 18 are formed in a stripe form such that the width is, for example, 10 $\mu$m, to thereby constitute a current injection region 21. On both sides of the current injection region 21, current non-injection regions 22 are formed in a groove form. The thickness t of the portions of the p-type cladding layer 18 remaining for the current non-injection regions 22 is 0.7 $\mu$m or less. Alternatively, the grooves constituting the current non-injection regions 22 may be formed so as to penetrate the active layer 16.

Further, a GaAs layer 31, a p-type $Al_{0.5}Ga_{0.5}As$ layer 32, and an n-type GaAs layer 33 are stacked on one another so as to cover the current injection region 21 in a stripe form and the portions of the p-type cladding layer 18 for the current non-injection regions 22, and an opening portion 34 is formed in the n-type GaAs layer 33 on the current injection region 21. A p-type electrode (p-type ohmic electrode)(not shown) is formed in the opening portion 34.

The first semiconductor laser emitting apparatus 1 emits a laser beam in a multi-lateral mode. Therefore, the width of the stripe-form portion constituting the current injection region 21 is set, for example, in the range of from 10 to 500 $\mu$m.

In the first semiconductor laser emitting apparatus 1 having the above-mentioned construction, the thickness t of the portions of the p-type cladding layer 18 for the current non-injection regions 22 is 0.7 $\mu$m or less. Therefore, the current leakage amount is suppressed. In addition, the waveguide of a laser is changed between the current injection region 21 in a stripe form and the current non-injection regions 22, so that a difference in optical absorption loss between the current injection region 21 and the current non-injection regions 22 keeps the laser directly under the portion in a stripe form, thus making it possible to obtain a stable NFP.

In contrast, when the thickness t of the portions of the p-type cladding layer 18 for the current non-injection regions 22 exceeds 0.7 $\mu$m, the current leakage amount is increased, and it becomes difficult to obtain a stable NFP.

Figure 2A:
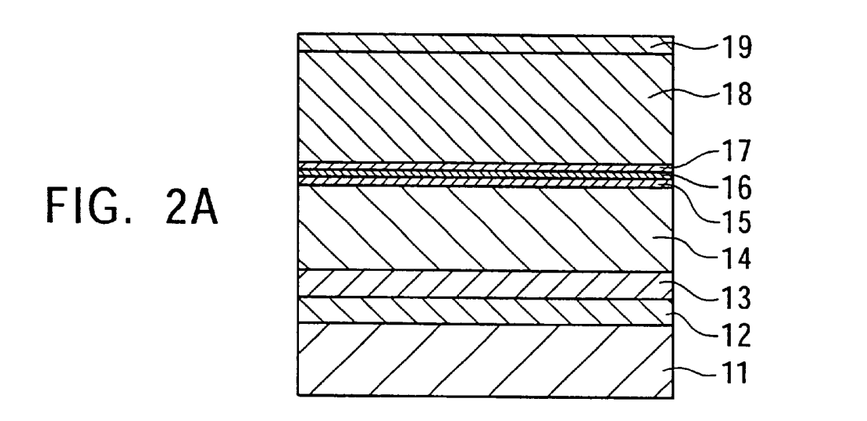
FIGS. 2A to 2C are diagrammatic cross-sectional views showing a process for producing a semiconductor laser emitting apparatus of the present invention.
Figure 2B:
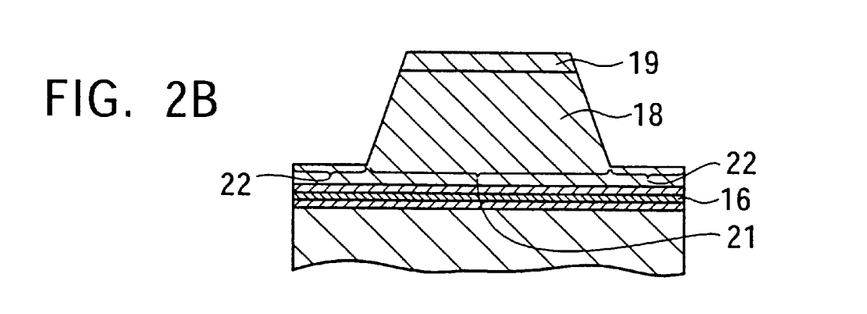
Figure 2C:
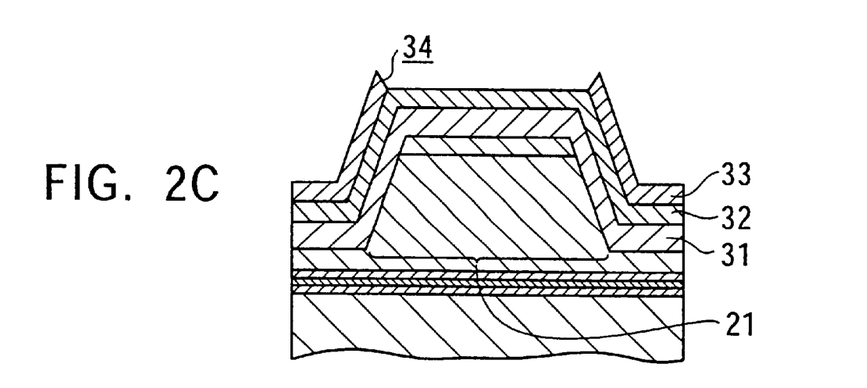

Next, a process for producing the first semiconductor laser emitting apparatus 1 is described below with reference to FIGS. 2A to 2C. In FIGS. 2A to 2C and FIG. 1, similar parts or portions are indicated by the same reference numerals. In addition, in FIGS. 2B and 2C, the lower layer portion is not shown.

As shown in FIG. 2A, on a surface side of a substrate 11 comprised of a GaAs substrate, a first n-type buffer layer 12, a second n-type buffer layer 13, an n-type cladding layer 14, a guide layer 15, an active layer 16, a guide layer 17, a p-type cladding layer 18, and a p-type cap layer 19 comprised of p-type GaAs are successively formed by a metal organic chemical vapor deposition (hereinafter, frequently referred to simply as "MOCVD") process under a reduced pressure of, for example, about 133 kPa.

As examples of the above layers, on the surface side of the substrate 11, n-type GaAs is deposited so as to have a thickness of, for example, 0.5 μm, to thereby form the first n-type buffer layer 12, and n-type $Al_{0.3}Ga_{0.7}As$ is deposited thereon so as to have a thickness of, for example, 0.5 μm, to thereby form the second n-type buffer layer 13. Then, n-type $Al_xGa_{1-x}As$ is deposited thereon so as to have a thickness of, for example, 1.8 μm, to thereby form the n-type cladding layer 14. Subsequently, $Al_{0.3}Ga_{0.7}As$ is deposited thereon so as to have a thickness of, for example, 60 to 65 nm, to thereby form the guide layer 15, and $Al_{0.1}Ga_{0.9}As$ is deposited thereon so as to have a thickness of, for example, 10 nm, to thereby form the active layer 16, and $Al_{0.3}Ga_{0.7}As$ is deposited thereon so as to have a thickness of, for example, 60 to 65 nm, to thereby form the guide layer 17. Then, p-type $Al_xGa_{1-x}As$ is deposited thereon so as to have a thickness of, for example, 1.8 μm, to thereby form the p-type cladding layer 18. In the above chemical formulae for the layer materials, the Al atomic ratio x is, for example, 0.5 (x=0.5).

Then, as shown in FIG. 2B, the p-type cap layer 19 and the p-type cladding layer 18 are processed using a lithography technique and an etching technique, to thereby form a current injection region 21 in a stripe form and current non-injection regions 22 in a groove form on both sides of the current injection region 21. The thickness t of the portions of the p-type cladding layer 18 remaining for the current non-injection regions 22 is 0.7 μm or less. Alternatively, the grooves constituting the current non-injection regions 22 may be formed so as to penetrate the active layer 16.

Then, as shown in FIG. 2C, a GaAs layer 31, a p-type $Al_{0.5}Ga_{0.5}As$ layer 32, and an n-type GaAs layer 33 are successively deposited so as to cover the current injection region 21 in a stripe form and the p-type cladding layer 18 by a MOCVD process.

Subsequently, the n-type GaAs layer 31 on the current injection region 21 in a stripe form is removed using a lithography technique and an etching technique, to thereby form an opening portion 34. Then, a step for diffusing zinc (Zn) is performed, and then, a p-type electrode (for example, p-type ohmic electrode)(not shown) and an n-type electrode (for example, n-type ohmic electrode)(not shown) are formed. With respect to the materials for the layers which are deposited after forming the stripe structure, there is no particular limitation, and, for example, these layers may be formed from only GaAs.

Figure 3:
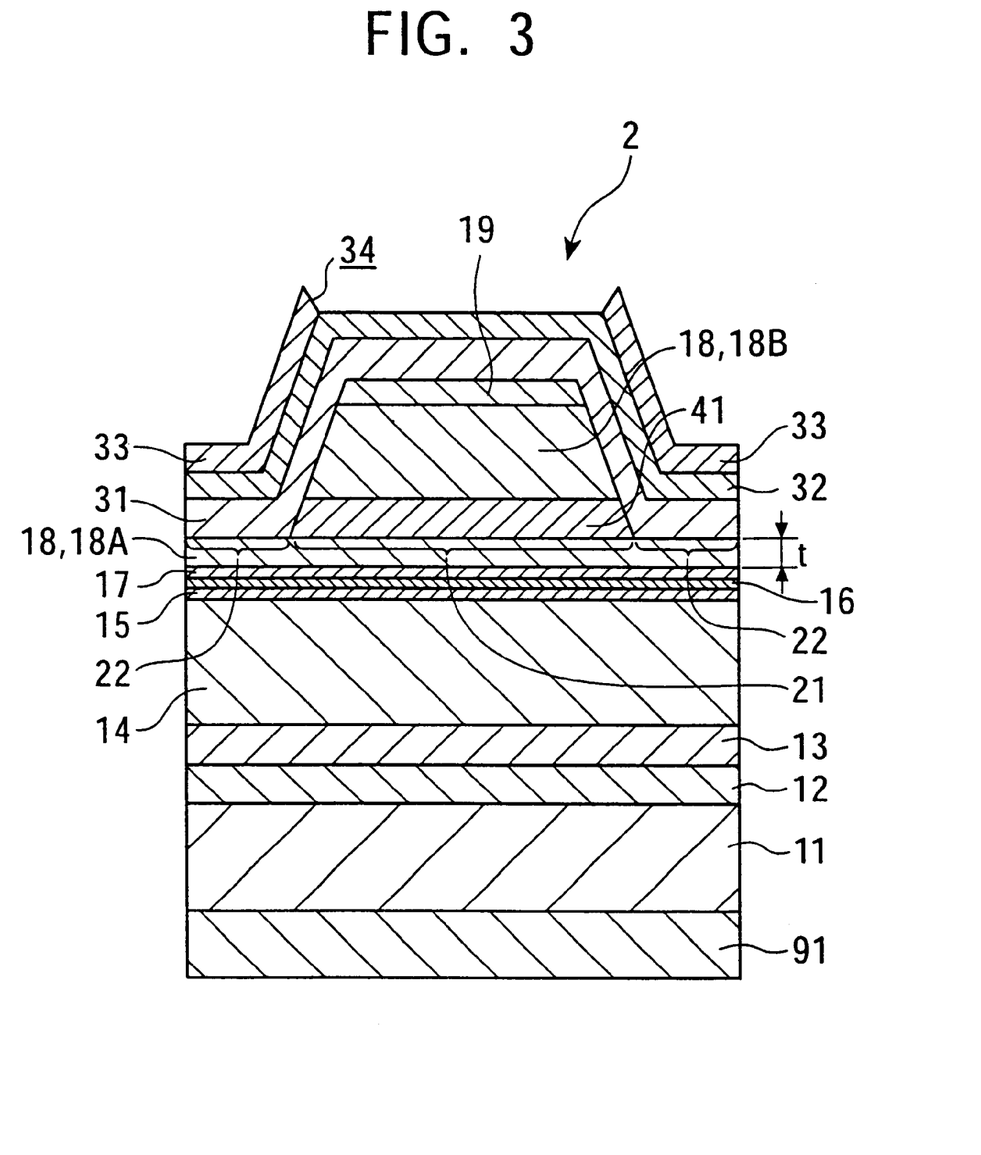
FIG. 3 is a diagrammatic cross-sectional view showing a semiconductor laser emitting apparatus according to the second embodiment of the present invention.

Next, another semiconductor laser emitting apparatus according to the second embodiment of the present invention is described below with reference to the diagrammatic cross-sectional view of FIG. 3. In FIG. 3 and FIG. 1, similar parts or portions are indicated by the same reference numerals. In addition, the portion lower than the active layer in the apparatus of the second embodiment is the same as that in the apparatus of the first embodiment. Therefore, in the second embodiment, the description in detail about the above portion is omitted, and a reference can be made to the corresponding descriptive portion in the first embodiment.

As shown in FIG. 3, in a second semiconductor laser emitting apparatus 2, on a surface side of a substrate 11 comprised of a GaAs substrate, a first n-type buffer layer 12, a second n-type buffer layer 13, an n-type cladding layer 14, a guide layer 15, an active layer 16, and a guide layer 17 are stacked on one another in this order. In the layers of from the first n-type buffer layer 12 to the guide layer 17, for example, the same materials as those for the corresponding layers in the semiconductor laser emitting apparatus of the first embodiment are used. On the other hand, on a back side of the substrate 11, an n-type electrode layer 91 is formed.

A p-type cladding layer 18 is formed on the guide layer 17 from, for example, a p-type $Al_xGa_{1-x}As$ layer, and a layer 41 having a refractive index larger than that of the layer therearound is formed from, for example, a p-type $Al_yGa_{1-y}As$ layer in the p-type cladding layer 18. In the above chemical formulae for the layer materials, the Al atomic ratios x and y satisfy, for example, a requirement that x be 0.5 (x=0.5) and x be larger than y (x>y). Accordingly, the p-type cladding layer 18 (18A), the layer 41 having a larger refractive index, the p-type cladding layer 18 (18B), and a p-type cap layer 19 are stacked on one another on the guide layer 17, and the layer 41 having a larger refractive index, the p-type cladding layer 18B and the p-type cap layer 19 constitute a current injection region 21 having a stripe structure such that the width is, for example, 10 μm. In the second semiconductor laser emitting apparatus 2, the thickness t of the p-type cladding layer 18 (18A) for current non-injection regions 22 is 0.7 μm or less. Alternatively, the grooves constituting the current non-injection regions 22 may be formed so as to penetrate the active layer 16.

Further, a GaAs layer 31, a p-type $Al_{0.5}Ga_{0.5}As$ layer 32, and an n-type GaAs layer 33 are stacked on one another so as to cover the p-type cladding layer 18 for the current injection region 21 in a stripe form and the current non-injection regions 22, and the p-type cap layer 19, and an opening portion 34 is formed in the n-type GaAs layer 33 on the current injection region 21. A p-type electrode (p-type ohmic electrode)(not shown) is formed in the opening portion 34.

The second semiconductor laser emitting apparatus 2 emits a laser beam in a multi-lateral mode. Therefore, the width of the stripe-form portion constituting the current injection region 21 is set, for example, in the range of from 10 to 500 μm.

In the second semiconductor laser emitting apparatus 2 having the above-mentioned construction, the thickness t of the p-type cladding layer 18A for the current non-injection regions 22 is 0.7 μm or less. Therefore, the current leakage amount is suppressed. In addition, the waveguide of a laser is changed between the current injection region 21 in a stripe form and the current non-injection regions 22, so that a difference in optical absorption loss between the current injection region 21 and the current non-injection regions 22 keeps the laser directly under the portion in a stripe form, thus making it possible to obtain a stable NFP.

In contrast, when the thickness t of the p-type cladding layer 18A for the current non-injection regions 22 exceeds 0.7 μm, the current leakage amount is increased, and it becomes difficult to obtain a stable NFP.

The second semiconductor laser emitting apparatus 2 may be produced by the following process. The layers of from the first n-type buffer layer 12 to the p-type cap layer 19 are formed on the substrate 11 by a MOCVD process under a reduced pressure, and then, a stripe structure is formed in the resultant layers using a lithography technique and an etching technique. Then, the GaAs layer 31, the p-type $Al_{0.5}G_{0.5}aAs$ layer 32, and the n-type GaAs layer 33 are successively formed thereon, and the opening portion 34 is formed in the same manner as that described in the first embodiment. Then, the p-type electrode (not shown) and the n-type electrode 91 are formed.

Figure 4:
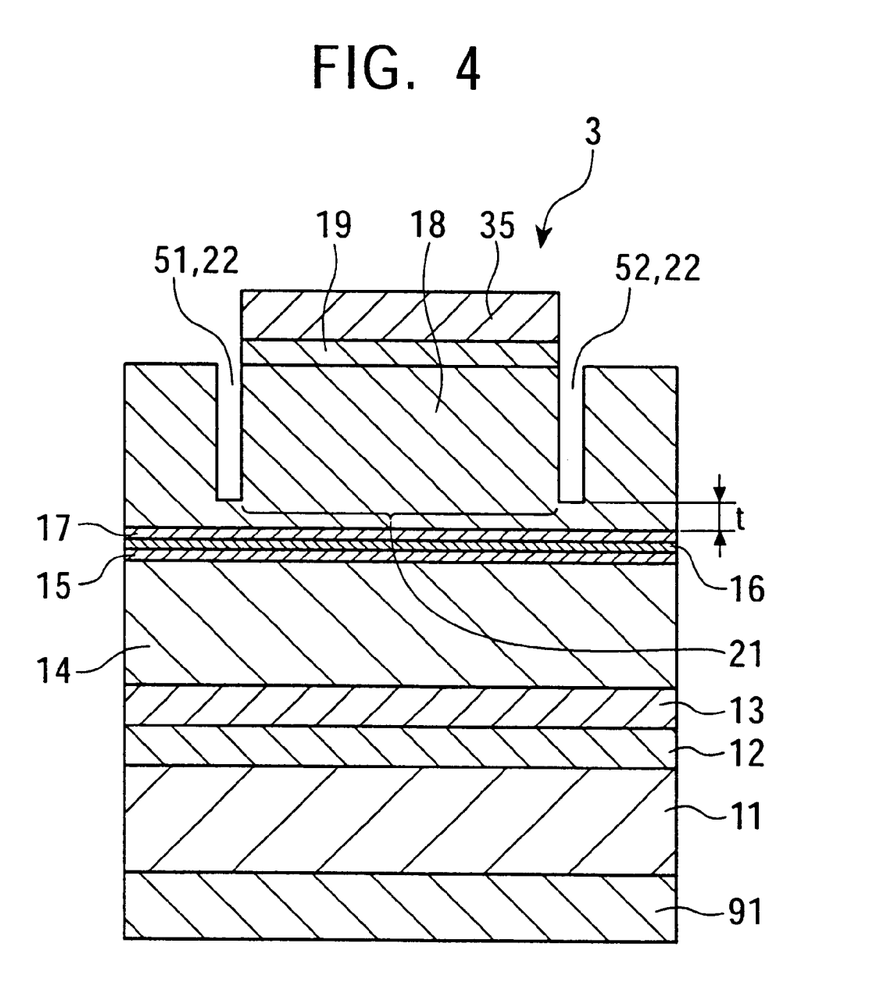
FIG. 4 is a diagrammatic cross-sectional view showing a semiconductor laser emitting apparatus according to the third embodiment of the present invention.

Next, another semiconductor laser emitting apparatus according to the third embodiment of the present invention is described below with reference to the diagrammatic cross-sectional view of FIG. 4. In FIG. 4 and FIG. 1, similar parts or portions are indicated by the same reference numerals. In addition, the portion lower than the active layer in the apparatus of the third embodiment is the same as that in the apparatus of the first embodiment. Therefore, in the third embodiment, the description in detail about the above portion is omitted, and a reference can be made to the corresponding descriptive portion in the first embodiment.

As shown in FIG. 4, in a third semiconductor laser emitting apparatus 3, on a surface side of a substrate 11 comprised of a GaAs substrate, a first n-type buffer layer 12, a second n-type buffer layer 13, an n-type cladding layer 14, a guide layer 15, an active layer 16, a guide layer 17, and a p-type cladding layer 18 are stacked on one another in this order.

Current constriction grooves 51, 52 which constitute current non-injection regions 22 are formed in the p-type cladding layer 18, and the portion in a stripe form between the current constriction grooves 51, 52 constitutes a current injection region 21. In the third semiconductor laser emitting apparatus 3, the thickness t of the portions of the p-type cladding layer 18 under the current constriction grooves 51, 52 is 0.7 $\mu$m or less. Alternatively, the current constriction grooves 51, 52 may be formed in a state such that they penetrate the active layer 16, and such a structure does not affect the properties of the third semiconductor laser emitting apparatus 3.

Further, a p-type cap layer 19 and a p-type electrode (p-type ohmic electrode) 35 are formed on the p-type cladding layer 18 for the current injection region 21 in a stripe form. On the other hand, on a back side of the substrate 11, an n-type electrode layer 91 is formed.

The third semiconductor laser emitting apparatus 3 emits a laser beam in a multi-lateral mode. Therefore, the width of the stripe-form portion constituting the current injection region 21 is set, for example, in the range of from 10 to 500 $\mu$m.

In the third semiconductor laser emitting apparatus 3 having the above-mentioned construction, the thickness t of the portions of the p-type cladding layer 18 under the current constriction grooves 51, 52 is 0.7 $\mu$m or less. Therefore, the current leakage amount is suppressed. In addition, the waveguide of a laser is changed between the inside and the outside of the current injection region 21 in a stripe form, so that a difference in optical absorption loss between the current injection region 21 and the current non-injection regions 22 keeps the laser directly under the portion in a stripe form, thus making it possible to obtain a stable NFP.

In contrast, when the thickness t of the portions of the p-type cladding layer 18 under the current constriction grooves 51, 52 exceeds 0.7 $\mu$m, the current leakage amount is increased, and it becomes difficult to obtain a stable NFP.

The third semiconductor laser emitting apparatus 3 may be produced by the following process. The layers of from the first n-type buffer layer 12 to the p-type cap layer 19 are formed on the substrate 11 by a reduced pressure CVD process, and then, the current constriction grooves 51, 52 are formed in the resultant layers using a lithography technique and an etching technique, to thereby form a stripe structure. Then, the p-type electrode 35 and the n-type electrode 91 are formed.

Figure 5:
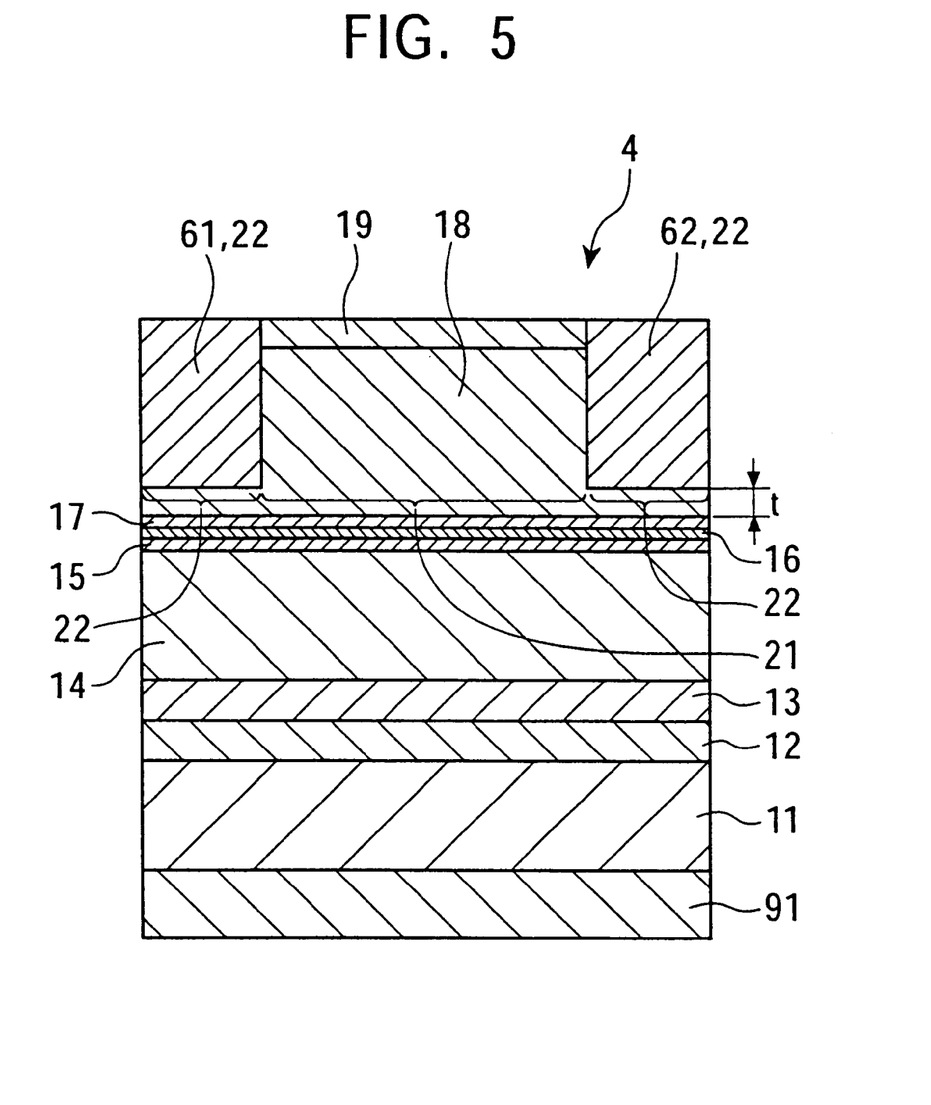
FIG. 5 is a diagrammatic cross-sectional view showing a semiconductor laser emitting apparatus according to the fourth embodiment of the present invention.

Next, another semiconductor laser emitting apparatus according to the fourth embodiment of the present invention is described below with reference to the diagrammatic cross-sectional view of FIG. 5. In FIG. 5 and FIG. 1, similar parts or portions are indicated by the same reference numerals. In addition, the portion lower than the active layer in the apparatus of the fourth embodiment is the same as that in the apparatus of the first embodiment. Therefore, in the fourth embodiment, the description in detail about the above portion is omitted, and a reference can be made to the corresponding descriptive portion in the first embodiment.

As shown in FIG. 5, in a fourth semiconductor laser emitting apparatus 4, on a surface side of a substrate 11 comprised of a GaAs substrate, a first n-type buffer layer 12, a second n-type buffer layer 13, an n-type cladding layer 14, a guide layer 15, an active layer 16, a guide layer 17, and a p-type cladding layer 18 are stacked on one another in this order. On the other hand, on a back side of the substrate 11, an n-type electrode layer 91 is formed.

Ion implantation regions 61, 62 which constitute current non-injection regions 22 are formed in the p-type cladding layer 18, and the portion in a stripe form between the ion implantation regions 61, 62 constitutes a current injection region 21. In the fourth semiconductor laser emitting apparatus 4, the thickness t of the portions of the p-type cladding layer 18 under the ion implantation regions 61, 62 is 0.7 $\mu$m or less. Alternatively, the ion implantation regions 61, 62 may be formed in a state such that they penetrate the active layer 16, and such a structure does not affect the properties of the fourth semiconductor laser emitting apparatus 4.

Further, a p-type cap layer 19 is formed on the p-type cladding layer 18 for the current injection region 21 in a stripe form.

The fourth semiconductor laser emitting apparatus 4 emits a laser beam in a multi-lateral mode. Therefore, the width of the stripe-form portion constituting the current injection region 21 is set, for example, in the range of from 10 to 500 $\mu$m.

In the fourth semiconductor laser emitting apparatus 4 having the above-mentioned construction, the thickness t of the portions of the p-type cladding layer 18 under the ion implantation regions 61, 62 is 0.7 $\mu$m or less. Therefore, the current leakage amount is suppressed. In addition, the waveguide of a laser is changed between the inside and the outside of the current injection region 21 in a stripe form, so that a difference in optical absorption loss between the current injection region 21 and the current non-injection regions 22 keeps the laser directly under the portion in a stripe form, thus making it possible to obtain a stable NFP.

In contrast, when the thickness t of the portions of the p-type cladding layer 18 under the ion implantation regions 61, 62 exceeds 0.7 $\mu$m, the current leakage amount is increased, and it becomes difficult to obtain a stable NFP.

The forth semiconductor laser emitting apparatus 4 may be produced by the following process. The layers of from the first n-type buffer layer 12 to the p-type cap layer 19 are formed on the substrate 11 by a reduced pressure CVD process, and then, the ion implantation regions 61, 62 are formed in the resultant layers using an ion implantation technique, to thereby form a stripe structure. Then, the p-type electrode (not shown) and the n-type electrode 91 are formed.

In each of the above embodiments, an explanation is made on the GaAs/AlGaAs semiconductor laser emitting apparatus which is obtained by allowing AlGaAs to grow on a GaAs substrate, but the construction of the semiconductor laser emitting apparatus of the present invention can be applied to a semiconductor laser emitting apparatus obtained using different substrates and materials. For example, a GaInP/AlGaInP semiconductor laser emitting apparatus or an AlGaN/InGaN semiconductor laser emitting apparatus to which the construction of the semiconductor laser emitting apparatus of the present invention is applied can be prevented from suffering the unfavorable phenomenon in which the NFP is unstable.

As examples of such semiconductor laser emitting apparatuses, a GaInP/AlGaInP semiconductor laser emitting apparatus which emits a red light is described below as the fifth embodiment of the present invention, with reference to the diagrammatic cross-sectional view of FIG. 6, and an AlGaN/InGaN semiconductor laser emitting apparatus which emits a blue light is described below as the sixth embodiment of the present invention, with reference to the diagrammatic cross-sectional view of FIG. 7.

Figure 6:
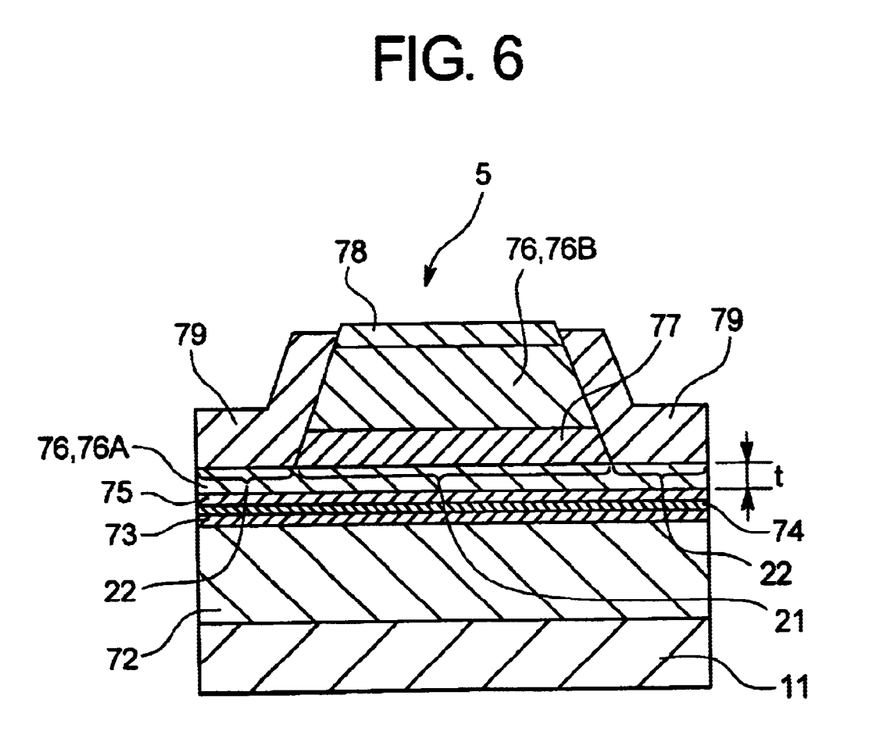
FIG. 6 is a diagrammatic cross-sectional view showing a semiconductor laser emitting apparatus according to the fifth embodiment of the present invention.

As shown in FIG. 6, in a GaInP/AlGaInP semiconductor laser emitting apparatus (fifth semiconductor laser emitting apparatus) 5 which emits a red light, on a surface side of an n-type substrate 11, an n-type cladding layer 72, a guide layer 73, an active layer 74, and a guide layer 75 are stacked on one another in this order. A p-type cladding layer 76 (76A, 76B) is formed on the guide layer 75, and a layer 77 having a refractive index larger than that of the layer therearound is formed in the p-type cladding layer 76 from, for example, a p-type $Al_xGaInP$ layer.

The n-type cladding layer 72 is formed from, for example, an n-type AlGaInP layer. The guide layer 73 is formed from, for example, a GaInP layer. The active layer 74 is formed from, for example, an AlGaInP layer. The guide layer 75 is formed from, for example, a GaInP layer. The p-type cladding layers 76A, 76B are formed from, for example, a p-type $Al_xGaInP$ layer. The layer 77 having a larger refractive index is formed from, for example, a p-type $Al_yGaInP$ layer. In the above chemical formulae for the layer materials, the Al atomic ratios x and y satisfy, for example, a requirement that x be larger than y (x>y).

Accordingly, the p-type cladding layer 76 (76A), the layer 77 having a larger refractive index, the p-type cladding layer 76 (76B), and a p-type cap layer (for example, a p-type GaAs layer) 78 are stacked on one another on the guide layer 75, and the layer 77 having a larger refractive index, the p-type cladding layer 76B, and the p-type cap layer 78 constitute a current injection region 21 having a stripe structure. In the fifth semiconductor laser emitting apparatus 5, the thickness t of the p-type cladding layer 76A is 0.7 μm or less.

In addition, for example, GaAs layers 79 are formed on current non-injection regions 22 on both sides of the current injection region 21.

The fifth semiconductor laser emitting apparatus 5 emits a laser beam in a multi-lateral mode. Therefore, the width of the stripe-form portion constituting the current injection region 21 is set, for example, in the range of from 10 to 500 μm.

In the fifth semiconductor laser emitting apparatus 5 having the above-mentioned construction, the thickness t of the p-type cladding layer 76A for the current non-injection regions 22 is 0.7 μm or less. Therefore, the current leakage amount is suppressed. In addition, the waveguide of a laser is changed between the inside and the outside of the current injection region 21 in a stripe form, so that a difference in optical absorption loss between the current injection region 21 and the current non-injection regions 22 keeps the laser directly under the portion in a stripe form, thus making it possible to obtain a stable NFP.

In contrast, when the thickness t of the p-type cladding layer 76A for the current non-injection regions 22 exceeds 0.7 μm, the current leakage amount is increased, and it becomes difficult to obtain a stable NFP.

The fifth semiconductor laser emitting apparatus 5 may be produced by the following process. The layers of from the n-type cladding layer 72 to the p-type cap layer 78 are formed on the substrate 11 by, for example, a reduced pressure CVD process, and then, the grooves which constitute the current non-injection regions 22 are formed using a lithography technique and an etching technique, to thereby form the current injection region 21 having a stripe structure. Then, electrodes are individually formed.

Figure 7:
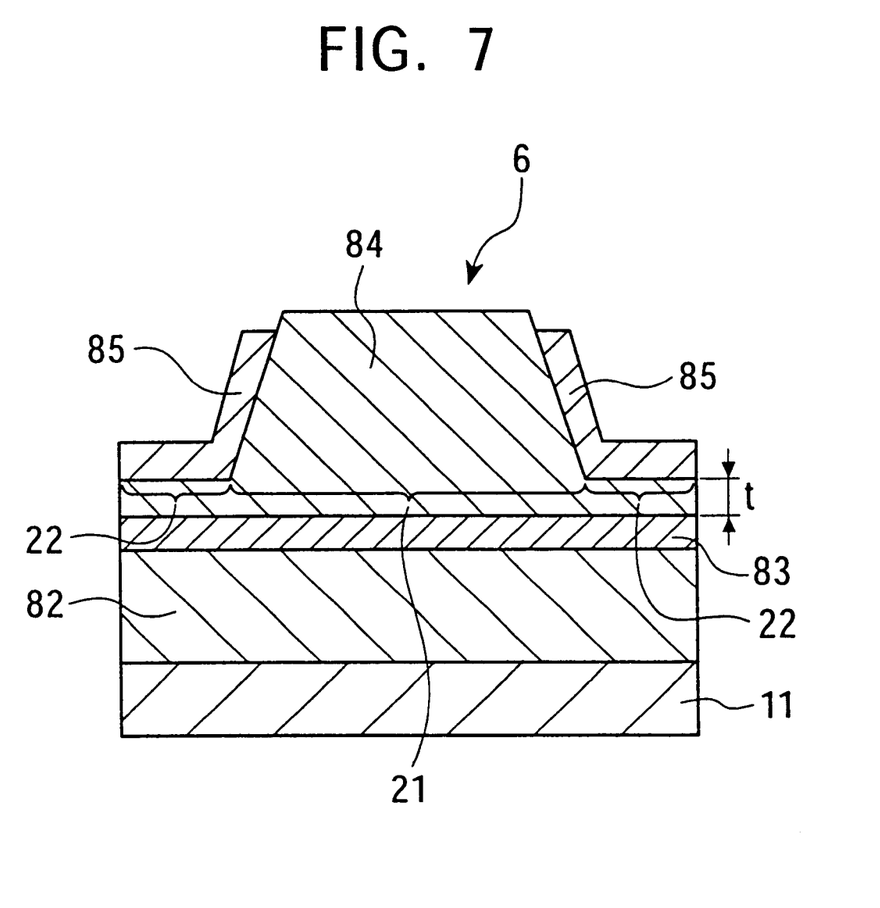
FIG. 7 is a diagrammatic cross-sectional view showing a semiconductor laser emitting apparatus according to the sixth embodiment of the present invention.

Next, as shown in FIG. 7, in an AlGaN/InGaN semiconductor laser emitting apparatus (sixth semiconductor laser emitting apparatus) 6 which emits a blue light, on a surface side of an n-type substrate 11, an n-type cladding layer 82 and an active layer 83 are stacked on one another in this order. A p-type cladding layer 84 is formed on the active layer 83, and a part of the p-type cladding layer 84 is in a stripe form, and this stripe-form portion constitutes a current injection region 21. In the sixth semiconductor laser emitting apparatus 6, the thickness t of the portions of the p-type cladding layer 84 at a bottom portion of the current non-injection regions 22 on both sides of the current injection region 21 having a stripe structure is 0.7 μm or less.

The n-type cladding layer 82 is formed from, for example, an n-type AlGaN layer having a thickness of 1.5 μm. The active layer 83 is formed from, for example, an InGaN layer having a thickness of 50 nm. The p-type cladding layer 84 is formed from, for example, a p-type AlGaN layer, and the stripe-form portions of the p-type cladding layer 84 is formed so as to have a thickness of, for example, 1.5 μm.

In addition, for example, AlGaN layers 85 are formed on the current non-injection regions 22 on both sides of the current injection region 21.

The current non-injection regions 22 on both sides of the current injection region 21 are formed from, for example, a GaAs layer.

The sixth semiconductor laser emitting apparatus 6 emits a laser beam in a multi-lateral mode. Therefore, the width of the stripe-form portion constituting the current injection region 21 is set, for example, in the range of from 10 to 500 μm.

In the sixth semiconductor laser emitting apparatus 6 having the above-mentioned construction, the thickness t of the portions of the p-type cladding layer 84 for the current non-injection regions 22 is 0.7 μm or less. Therefore, the current leakage amount is suppressed. In addition, the waveguide of a laser is changed between the inside and the outside of the current injection region 21 in a stripe form, so that a difference in optical absorption loss between the current injection region 21 and the current non-injection regions 22 keeps the laser directly under the portion in a stripe form, thus making it possible to obtain a stable NFP.

In contrast, when the thickness t of the portions of the p-type cladding layer 84 for the current non-injection regions 22 exceeds 0.7 µm, the current leakage amount is increased, and it becomes difficult to obtain a stable NFP.

The sixth semiconductor laser emitting apparatus 6 may be produced by the following process. The layers of from the n-type cladding layer 82 to the p-type cladding layer 84 are formed on the substrate 11 by, for example, a reduced pressure CVD process, and then, the grooves which constitute the current non-injection regions 22 are formed using a lithography technique and an etching technique, to thereby form the current injection region 21 having a stripe structure. Then, electrodes (not shown) are individually formed.

What is claimed is:

1. A semiconductor laser emitting apparatus which emits a laser beam in a multi-lateral mode, said semiconductor laser emitting apparatus comprising a cladding layer having a stripe form portion formed on an active layer, the stripe form portion of the cladding layer having at least a bottom width of from 10 to 500 µm, wherein:
   the stripe form portion of the cladding layer constitutes a current injection region, the semiconductor laser emitting apparatus having a difference in optical absorption loss between an inside and an outside of a bottom width of said current injection region, and
   said cladding layer disposed on the outside of the bottom width of said current injection region is formed so as to have a thickness of 0.7 µm or less.

2. The semiconductor laser emitting apparatus according to claim 1, wherein said semiconductor laser emitting apparatus has a difference in refractive index between the inside and the outside of the bottom width of the current injection region.

3. A semiconductor laser emitting apparatus which emits a laser beam in a multi-lateral mode, said semiconductor laser emitting apparatus comprising a cladding layer having a stripe form formed on an active layer, the stripe form of the cladding layer having a bottom width of from 10 to 500 µm, wherein:
   the stripe form of the cladding layer constitutes a current injection region, the semiconductor laser emitting apparatus having a difference in optical absorption loss between an inside and an outside of a bottom width of said current injection region, and
   said cladding layer is formed only inside the bottom width of said current injection region.

4. The semiconductor laser emitting apparatus according to claim 3, wherein said semiconductor laser emitting apparatus has a difference in refractive index between the inside and the outside of the bottom width of the current injection region.

5. A semiconductor laser emitting apparatus which emits a laser beam in a multi-lateral mode, said semiconductor laser emitting apparatus comprising:
   a first cladding layer;
   an active layer formed on the first cladding layer; and
   a second cladding layer formed on the active layer, the second cladding layer having at least three layers including
      a lower cladding layer having a refractive index formed on the active layer;
      a high refractive index layer having a higher refractive index than the lower cladding layer formed in a stripe form on the lower cladding layer, the high refractive index layer having at least a bottom stripe width of from 10 to 500 µm; and
      an upper cladding layer formed in a stripe form on the high refractive index layer, the upper cladding layer having a same refractive index as the lower cladding layer and having a bottom width equal to a top width of the high refractive index layer,
   wherein the high refractive index layer and the upper cladding layer constitute a current injection region, the semiconductor laser emitting apparatus having a difference in optical absorption loss between an inside and an outside of a bottom width of the current injection region, and
   wherein the lower cladding layer disposed outside of the bottom width of the current injection region is formed so as to have a thickness of 0.7 µm or less.

6. The semiconductor laser emitting apparatus according to claim 5, wherein said semiconductor laser emitting apparatus has a difference in refractive index between the inside and the outside of the bottom width of the current injection region.

7. A semiconductor laser emitting apparatus which emits a laser beam in a multi-lateral mode, said semiconductor laser emitting apparatus comprising:
   a first cladding layer;
   an active layer formed on the first cladding layer;
   a second cladding layer formed on the active layer, the second cladding layer having at least three layers including
      a lower cladding layer having a refractive index formed on the active layer;
      a high refractive index layer having a higher refractive index than the lower cladding layer formed in a stripe form on the lower cladding layer, the high refractive index layer having at least a bottom stripe width of from 10 to 500 µm; and
      an upper cladding layer formed in a stripe form on the high refractive index layer, the upper cladding layer having a same refractive index as the lower cladding layer and having a bottom width equal to a top width of the high refractive index layer,
   wherein the high refractive index layer and the upper cladding layer constitute a current injection region, the semiconductor laser emitting apparatus having a difference in optical absorption loss between an inside and an outside of a bottom width of the current injection region, and
   wherein said lower cladding layer is formed only beneath the bottom width of said current injection region.

8. The semiconductor laser emitting apparatus according to claim 7, wherein said semiconductor laser emitting apparatus has a difference in refractive index between the inside and the outside of the bottom width of the current injection region.

9. A semiconductor laser emitting apparatus which emits a laser beam in a multi-lateral mode, said semiconductor laser emitting apparatus comprising:
   a cladding layer formed on an active layer, the cladding layer having a first and a second current constriction groove formed therein spaced from 10 to 500 µm apart, the first and second current constriction grooves being current non-injection regions, wherein:
      a portion of the cladding layer formed between the first and second current constriction grooves constitutes a current injection region, said semiconductor laser emitting apparatus having a difference in optical absorption loss between an inside and an outside of a bottom width of said current injection region, and
      a portion of the cladding layer disposed beneath the first and second current constriction grooves has a thickness of 0.7 µm or less.

10. The semiconductor laser emitting apparatus according to claim 9, wherein said semiconductor laser emitting apparatus has a difference in refractive index between the inside and the outside of the bottom width of the current injection region.

11. A semiconductor laser emitting apparatus which emits a laser beam in a multi-lateral mode, said semiconductor laser emitting apparatus comprising:

a cladding layer formed on an active layer, the cladding layer having a first and a second current constriction groove formed therein spaced from 10 to 500 μm apart, the first and second current constriction grooves being current non-injection regions, wherein:

a portion of the cladding layer formed between the first and second current constriction grooves constitutes a current injection region, said semiconductor laser emitting apparatus having a difference in optical absorption loss between an inside and an outside of a bottom width of said current injection region, and the first and second current constriction grooves are formed such that the first and second current constriction grooves penetrate the active layer.

12. The semiconductor laser emitting apparatus according to claim 11, wherein said semiconductor laser emitting apparatus has a difference in refractive index between the inside and the outside of the bottom width of the current injection region.

13. semiconductor laser emitting apparatus which emits a laser beam in a multi-lateral mode, said semiconductor laser emitting apparatus comprising:

a cladding layer formed on an active layer, the cladding layer having a first and a second ion implantation region formed therein spaced from 10 to 500 μm apart, the first and second ion implantation regions being current non-injection regions, wherein:

a portion of the cladding layer between the first and second ion implantation regions constitutes a current injection region, said semiconductor laser emitting apparatus having a difference in optical absorption loss between an inside and an outside of a bottom width of said current injection region, and the cladding layer disposed beneath the first and second ion implantation regions has a thickness of 0.7 μm or less.

14. The semiconductor laser emitting apparatus according to claim 13, wherein said semiconductor laser emitting apparatus has a difference in refractive index between the inside and the outside of the bottom width of the current injection region.

15. A semiconductor laser emitting apparatus which emits a laser beam in a multi-lateral mode, said semiconductor laser emitting apparatus comprising:

a cladding layer formed on an active layer, the cladding layer having a first and a second ion implantation region formed therein spaced from 10 to 500 μm apart, the first and second ion implantation regions being current non-injection regions, wherein:

a portion of the cladding layer between the first and second ion implantation regions constitutes a current injection region, said semiconductor laser emitting apparatus having a difference in optical absorption loss between an inside and an outside of a bottom width of said current injection region, and the first and second ion implantation regions are formed such that the first and second ion implantation regions penetrate the active layer.

16. The semiconductor laser emitting apparatus according to claim 15, wherein said semiconductor laser emitting apparatus has a difference in refractive index between the inside and the outside of the bottom width of the current injection region.

* * * * *